US012765206B2

(12) United States Patent
Park et al.

(10) Patent No.: US 12,765,206 B2
(45) Date of Patent: Oct. 13, 2026

(54) DISPLAY DEVICE

(71) Applicant: LG DISPLAY CO., LTD., Seoul (KR)

(72) Inventors: SungJin Park, Paju-si (KR); SangBin Lee, Paju-si (KR); Mihee Shin, Paju-si (KR); SeungHyun Lee, Paju-si (KR); Junghun Choi, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 750 days.

(21) Appl. No.: 17/963,745

(22) Filed: Oct. 11, 2022

(65) Prior Publication Data

US 2023/0157117 A1 May 18, 2023

(30) Foreign Application Priority Data

Nov. 12, 2021 (KR) ........................ 10-2021-0155825

(51) Int. Cl.
*H01L 27/32* (2006.01)
*H01L 51/52* (2006.01)
(Continued)

(52) U.S. Cl.
CPC ......... *H10K 59/353* (2023.02); *H10K 59/352* (2023.02); *H10K 59/8792* (2023.02); *H10K 59/65* (2023.02)

(58) Field of Classification Search
CPC ............... H10K 59/353; H10K 59/352; H10K 59/8792; H10K 59/126; H10K 59/121;
(Continued)

(56) References Cited

U.S. PATENT DOCUMENTS 11,650,633 B2 5/2023 Lou et al.
11,723,255 B2 8/2023 Hong et al.
(Continued)

FOREIGN PATENT DOCUMENTS

CN 110264894 A 9/2019
CN 110767662 A 2/2020
(Continued)

*Primary Examiner* — Steven B Gauthier
*Assistant Examiner* — Rhys Poniente Sheker
(74) *Attorney, Agent, or Firm* — Birch, Stewart, Kolasch & Birch, LLP

(57) ABSTRACT

A display device a display panel including a plurality of light emitting areas; a first optical electronic device located under the display panel; and a second optical electronic device located under the display panel. Further, a first optical area of the display panel overlapping the first optical electronic device includes a plurality of first light transmission areas in addition to the plurality of light emitting areas, a second optical area of the display panel overlapping the second optical electronic device includes a plurality of second light transmission areas in addition the plurality of light emitting areas, a third optical area of the display panel not overlapping the first and second optical electronic devices includes the plurality of light emitting areas without including the first and second light transmission areas, and the first light transmission areas have a different shape or size than the second light transmission areas so a light transmittance of incident light through the first light transmission areas is different than a light transmittance of incident light through the second light transmission areas.

18 Claims, 15 Drawing Sheets

(51) Int. Cl.

| | |
|---|---|
| ***H10K 59/35*** | (2023.01) |
| ***H10K 59/80*** | (2023.01) |
| *H10K 59/65* | (2023.01) |

(58) Field of Classification Search

CPC ........ H10K 59/00–95; H10K 50/00–88; G09F 9/33; G09F 9/335; G09F 9/35; G02F 1/13338

See application file for complete search history.

(56) References Cited

U.S. PATENT DOCUMENTS

| | | | | |
|---|---|---|---|---|
| 11,882,749 | B2 | 1/2024 | Xu et al. | |
| 2019/0229275 | A1 | 7/2019 | Lee et al. | |
| 2021/0029336 | A1 | 1/2021 | Liu et al. | |
| 2021/0065625 | A1* | 3/2021 | Wang | H10K 59/353 |
| 2021/0126173 | A1 | 4/2021 | Jeon et al. | |
| 2021/0191552 | A1 | 6/2021 | Bok et al. | |
| 2021/0193755 | A1 | 6/2021 | Kim et al. | |
| 2021/0233976 | A1* | 7/2021 | Lee | H10K 59/353 |
| 2021/0335920 | A1 | 10/2021 | Hong et al. | |
| 2021/0376009 | A1* | 12/2021 | Jeon | H10K 59/65 |
| 2022/0020777 | A1* | 1/2022 | Baek | H10D 86/441 |
| 2022/0020778 | A1* | 1/2022 | Lius | H10D 86/441 |
| 2024/0099092 | A1 | 3/2024 | Kim et al. | |

FOREIGN PATENT DOCUMENTS

| | | | |
|---|---|---|---|
| CN | 110970480 | A | 4/2020 |
| CN | 111292617 | A | 6/2020 |
| CN | 113640174 | A | 10/2021 |
| EP | 4 002 476 | A1 | 5/2022 |
| EP | 4 007 004 | A1 | 6/2022 |
| EP | 4 141 859 | A1 | 3/2023 |
| EP | 4 145 970 | A1 | 3/2023 |
| EP | 4 181 649 | A1 | 5/2023 |
| KR | 10-2020-0138509 | A | 12/2020 |
| KR | 10-2020-0144193 | A | 12/2020 |
| KR | 10-2021-0002232 | A | 1/2021 |
| KR | 10-2021-0048323 | A | 5/2021 |
| KR | 10-2021-0050023 | A | 5/2021 |
| KR | 10-2021-0130906 | A | 11/2021 |
| WO | 2017/129126 | A1 | 8/2017 |
| WO | WO 2021/169614 | A1 | 9/2021 |

* cited by examiner

DISPLAY DEVICE

CROSS-REFERENCE TO RELATED APPLICATION

This application claims the priority benefit of Republic of Korea Patent Application No. 10-2021-0155825, filed on Nov. 12, 2021, in the Korean Intellectual Property Office, the entire contents of which are hereby expressly incorporated by reference in its entirety into the present application.

BACKGROUND OF THE DISCLOSURE

Technical Field

The present disclosure relates to electronic devices, and more particularly, to a display device capable of improving transmittance of an area in which an optical device is disposed.

Description of the Related Art

Display devices provide functions such as an image capture function, a sensing function, and an image display function. Accordingly, the device display device includes a corresponding optical electronic device, such as a camera, a sensor for detecting an image, and the like.

In addition, the optical electronic device is located in a front portion of the display device where incident light can be advantageously received or detected. However, installing the optical electronic device in such an implementation increases the size of the bezel, and requires a notch or a hole formed in the display device.

SUMMARY OF THE DISCLOSURE

Accordingly, one aspect of the present disclosure is to dispose one or more optical electronic devices in a display device without reducing a display area of the display device.

Another aspect of the present disclosure is to provide a display panel having a light transmission structure including an optical electronic device located under a display area of the display panel, and not exposed in the front surface of the display device.

In another aspect, the present disclosure provides a display device including a high transmittance area where an optical electronic device is disposed and which is formed through a simple process.

In still another aspect, the present disclosure provides a display device capable of reducing a non-display area of a display panel and enabling an optical electronic device not to be exposed in the front surface of the display panel by disposing the optical electronic device under a display area, or in a lower portion, of the display panel.

The present disclosure also provides a display device having a light transmission structure in which an optical electronic device located under or in a lower portion of a display area has a capability of normally receiving or detecting light.

The present disclosure also provides a display device capable of normally performing display driving in an optical area included in a display area of a display panel and overlapping an optical electronic device.

To achieve these and other aspect, the present invention provides a display device including a display panel including a display area including a first optical area that includes a plurality of light emitting areas and a plurality of first transmission areas, a second optical area that is different from the first optical area and includes a plurality of light emitting areas and a plurality of second transmission areas, and a normal area that is located outside of the first and second optical areas and includes a plurality of light emitting areas, and a non-display area; and a first optical electronic device that is located under, or in a lower portion of, the display panel and overlaps at least a portion of the first optical area included in the display area, and a second optical electronic device that overlaps at least a portion of the second optical area. In this display device, an area or size of each of the plurality of first transmission areas is different from an area or size of each of the plurality of second transmission areas.

The present disclosure also provides a display device for reducing a non-display area of a display panel and enabling an optical electronic device not to be exposed in the front surface of the display panel by disposing the optical electronic device under a display area, or in a lower portion, of the display panel.

Further, the present disclosure provides a display device having a light transmission structure in which an optical electronic device located under a display area, or in a lower portion, of a display panel has a capability of normally receiving or detecting light.

A display device is also provided that is capable of normally performing display driving in an optical area included in a display area of a display panel and overlapping an optical electronic device. Further, the display device has a high transmittance area where an optical electronic device is disposed.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings. Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION OF THE EMBODIMENTS

Figure 1A:
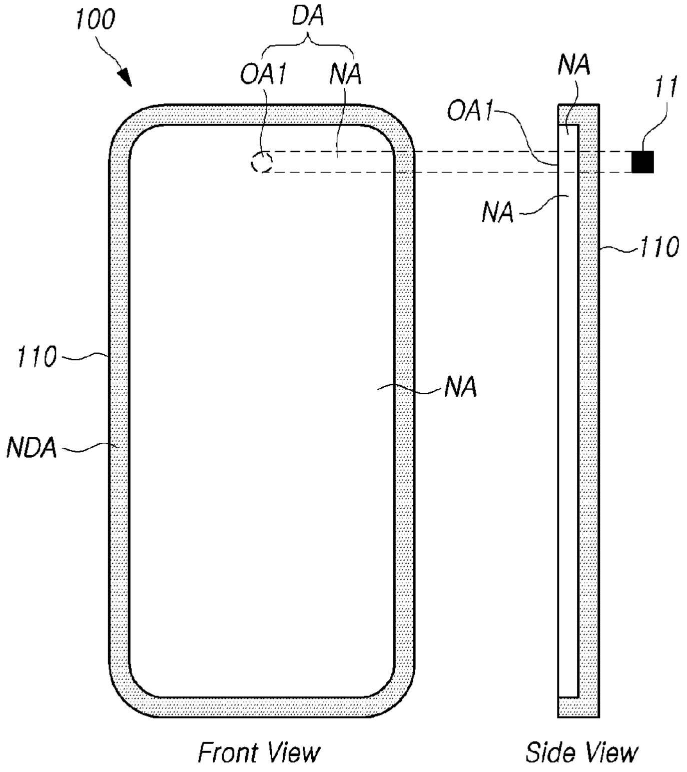
FIGS. 1A, 1B, 1C and 1D are plan views illustrating an example display device according to aspects of the present disclosure.

Reference will now be made in detail to embodiments of the present disclosure, examples of which may be illustrated in the accompanying drawings. In the following description, the structures, embodiments, implementations, methods and operations described herein are not limited to the specific example or examples set forth herein and may be changed as is known in the art, unless otherwise specified. Names of the respective elements used in the following explanations are selected only for convenience of writing the specification and may thus be different from those used in actual products.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals designate like elements throughout, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise. Singular forms used herein are intended to include plural forms unless the context clearly indicates otherwise.

In construing an element, the element is to be construed as including an error or tolerance range even where no explicit description of such an error or tolerance range is provided. Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference. Time relative terms, such as "after", "subsequent to", "next to", "before", or the like, used to describe a temporal relationship between events, operations, or the like are generally intended to include events, situations, cases, operations, or the like that do not occur consecutively unless the terms, such as "directly", "immediately", or the like, are used.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," A, B, (a), (b), and the like may be used herein to describe various elements, these elements should not be interpreted to be limited by these terms as they are not used to define a particular order or precedence. These terms are merely used herein for distinguishing an element from other elements. The expression of a first element, a second elements "and/or" a third element should be understood as one of the first, second and third elements or as any or all combinations of the first, second and third elements.

By way of example, A, B and/or C can refer to only A, only B, or only C; any or some combination of A, B, and C; or all of A, B, and C. Therefore, a first element mentioned below may be a second element in a technical concept of the present disclosure. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Hereinafter, with reference to the accompanying drawings, various embodiments of the present disclosure will be described in detail. In particular, FIGS. 1A-1D are plan views illustrating an example display device 100 according to aspects of the present disclosure.

Referring to FIGS. 1A-1D, the display device 100 includes a display panel 110 for displaying images, and one or more optical electronic devices 11 and 12. As shown, the display panel 110 includes a display area DA in which an image is displayed and a non-display area NDA in which an image is not displayed.

Further, a plurality of subpixels are arranged in the display area DA, and several types of signal lines for driving the plurality of subpixels are arranged therein. The non-display area NDA refers to an area outside of the display area DA. Several types of signal lines are arranged in the non-display area NDA and are connected to driving circuits. At least a portion of the non-display area NDA can also be bent from the front of the display panel or be covered by a case of the display panel 110 or the display device 100. The non-display area NDA can also be referred to as a bezel or a bezel area.

As shown, in the display device 100, one or more optical electronic devices 11 and 12 are located under, or in a lower portion of, the display panel 110 (an opposite side to the viewing surface thereof). Thus, light can enter the front surface (viewing surface) of the display panel 110, pass through the display panel 110, and reach the optical electronic devices 11 and 12 located under, or in the lower portion of, the display panel 110.

Further, the one or more optical electronic devices 11 and 12 can receive or detect light transmitting through the display panel 110 and perform a predefined function based on the received light. For example, the optical electronic devices 11 and/or 12 includes an image capture device such as a camera (an image sensor), or a sensor such as a proximity sensor, an illuminance sensor, and/or the like.

Referring to FIGS. 1A-1D, the display area DA includes one or more optical areas OA1 and OA2 and a normal area NA. Herein, the term "normal area" NA is an area that while being present in the display area DA, does not overlap with the optical electronic devices 11 and 12 and thus can be referred to as a non-optical area. Also, the one or more optical areas OA1 and OA2 overlap the optical electronic devices 11 and 12.

Figure 1B:
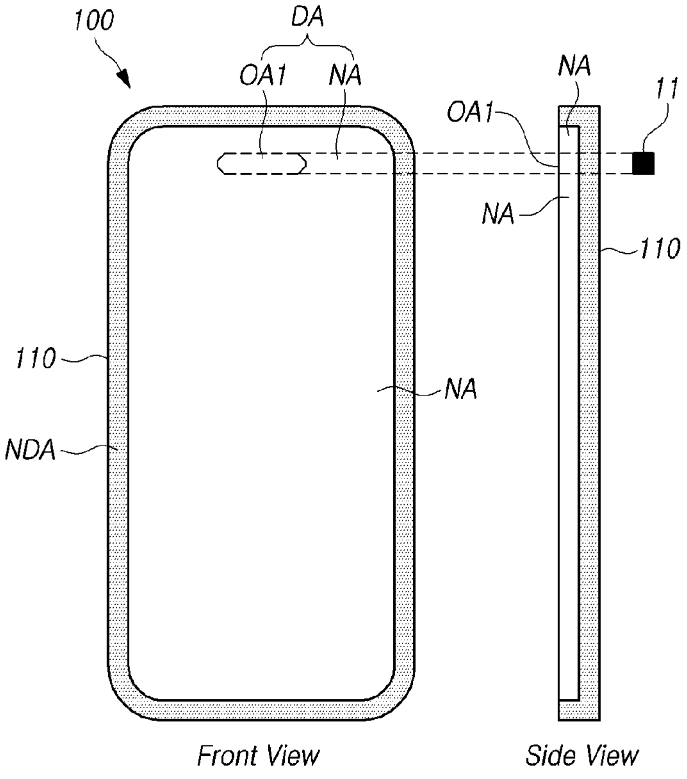

In more detail, FIG. 1A illustrates the display area DA including a first optical area OA1 and a normal area NA. In this example, at least a portion of the first optical area OA1 overlaps the first optical electronic device 11. Although FIG. 1A illustrates the first optical area OA1 has a circular shape, the shape of the first optical area OA1 according to embodiments of the present disclosure is not limited thereto. For example, as shown in FIG. 1B, the first optical area OA1 can have an elongated oval shape, an octagonal shape, or various polygonal shapes.

Figure 1C:
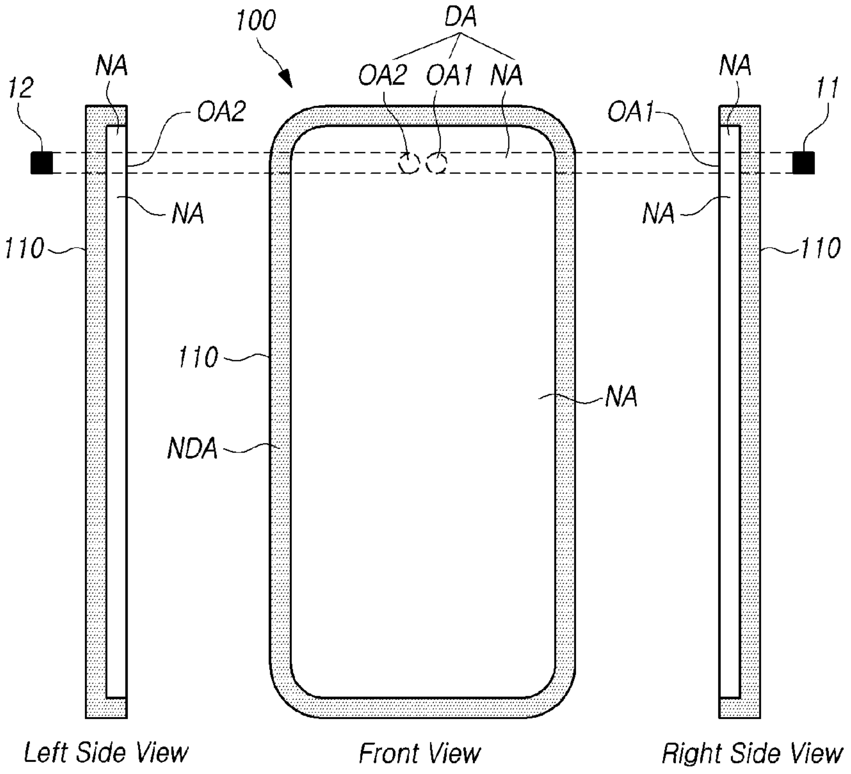

FIG. 1C illustrates the display area DA including a first optical area OA1, a second optical area OA2, and a normal area NA. In the example of FIG. 1C, at least a portion of the normal area NA is present between the first optical area OA1 and the second optical area OA2. In this example, at least a portion of the first optical area OA1 overlaps the first optical electronic device 11, and at least a portion of the second optical area OA2 overlaps a second optical electronic device 12.

Figure 1D:
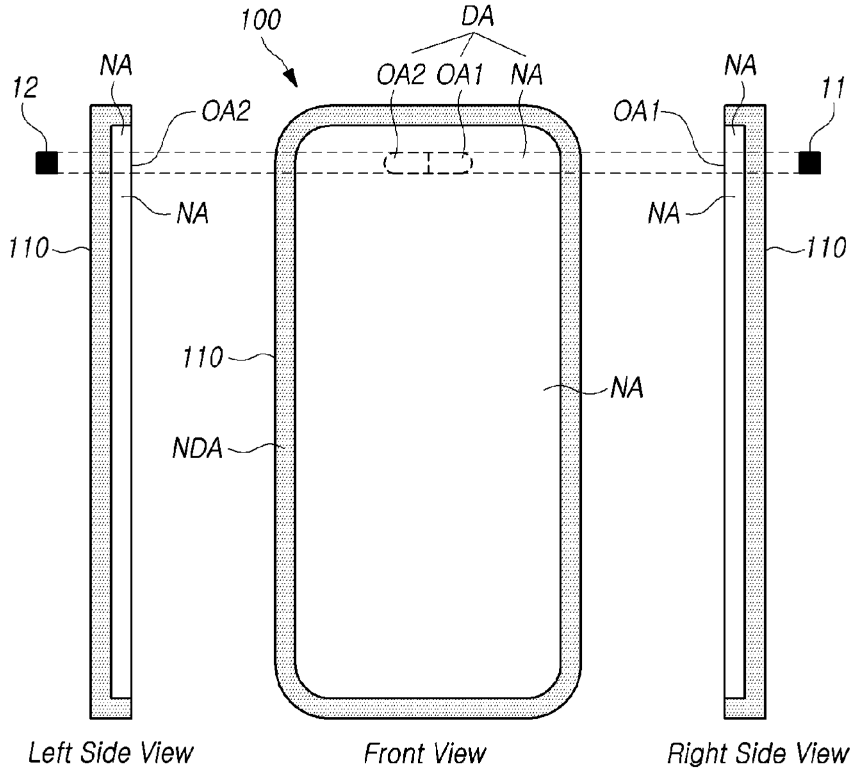

Next, FIG. 1D illustrates the display area DA including a first optical area OA1, a second optical area OA2, and a normal area NA. In the example of FIG. 1D, the normal area NA is not present between the first optical area OA1 and the second optical area OA2. That is, the first optical area OA1 and the second optical area OA2 contact each other (e.g., directly contact each other). In this example, at least a portion of the first optical area OA1 overlaps the first optical electronic device 11, and at least a portion of the second optical area OA2 overlaps the second optical electronic device 12.

In some embodiments, an image display structure and a light transmission structure are preferably formed in the one or more optical areas OA1 and OA2. For example, because the one or more optical areas OA1 and OA2 are a portion of the display area DA, subpixels for displaying an image are disposed in the one or more optical areas OA1 and OA2. Further, to enable light to transmit to the one or more optical electronic devices 11 and 12, a light transmission structure is formed in the one or more optical areas OA1 and OA2.

Even though the optical electronic devices 11 and 12 are used to receive or detect light, the optical electronic devices 11 and 12 can be located on the back of the display panel 110 (e.g., on an opposite side of a viewing surface). In this embodiment, the optical electronic devices 11 and 12 are located, for example, under, or in a lower portion of, the display panel 110, and are configured to receive light that has transmitted through the display panel 110. For example, the optical electronic devices 11 and 12 are not exposed in the front surface (viewing surface) of the display panel 110. Accordingly, when a user looks at the front of the display device 100, the one or more optical electronic devices 11 and 12 are not visible to the user.

In one embodiment, the first optical electronic device 11 can be a camera, and the second optical electronic device 12 can be a sensor such as a proximity sensor, an illuminance sensor, an infrared sensor, and/or the like. For example, the camera can include a camera lens, an image sensor, or a unit including at least one of the camera lens and the image sensor. The sensor can be, for example, an infrared sensor capable of detecting infrared rays. In another embodiment, the first optical electronic device 11 can be a sensor, and the second optical electronic device 12 can be a camera.

Hereinafter, the description refers to the first optical electronic device 11 as a camera, and the second optical electronic device 12 as a sensor. However, the first optical electronic device 11 can be the sensor, and the second optical electronic device 12 can be the camera. In addition, the camera can be a camera lens, an image sensor, or a unit including at least one of the camera lens and the image sensor.

When the first optical electronic device 11 is a camera, the camera is located on the back of (e.g., under, or in a lower portion of) the display panel 110, and can be a front camera capable of capturing objects or images in a front direction of the display panel 110. Accordingly, the user can capture an image or object through the camera that appears invisible on the viewing surface.

Although the normal area NA and the optical areas OA1 and OA2 include image display areas, the normal area NA is an area where a light transmission structure can be omitted. However, the optical areas OA1 and OA2 include the light transmission structure. Thus, in some embodiments, the normal area NA can omit a light transmission structure, and the optical areas OA1 and OA2 can include the light transmission structure.

Accordingly, the optical areas OA1 and OA2 can have a transmittance greater than or equal to a predetermined level, i.e., a relatively high transmittance, and the normal area NA does not have light transmittance or has a transmittance less than the predetermined level i.e., a relatively low transmittance. For example, the optical areas OA1 and OA2 can have a resolution, a subpixel arrangement structure, the number of subpixels per unit area, an electrode structure, a line structure, an electrode arrangement structure, a line arrangement structure, or/and the like different from that/those of the normal area NA.

In one embodiment, the number of subpixels per unit area in the optical areas OA1 and OA2 can be smaller than the number of subpixels per unit area in the normal area NA. For example, the resolution of the optical areas OA1 and OA2 can be lower than that of the normal area NA. Here, the number of subpixels per unit area can be a unit for measuring resolution, for example, referred to as pixels (or subpixels) per inch (PPI), which represents the number of pixels within 1 inch.

In one embodiment, the number of subpixels per unit area in the first optical areas OA1 can be smaller than the number of subpixels per unit area in the normal area NA. Also, the number of subpixels per unit area in the second optical areas OA2 can be greater than or equal to the number of subpixels per unit area in the first optical areas OA1.

Further, the first optical area OA1 can have various shapes, such as a circle, an ellipse, a quadrangle, a hexagon, an octagon or the like. Also, in FIGS. 1C, and 1D, the second optical area OA2 can have various shapes, such as a circle, an ellipse, a quadrangle, a hexagon, an octagon or the like. The first optical area OA1 and the second optical area OA2 can also have the same shape or different shapes. Referring to FIG. 1C, when the first optical area OA1 and the second optical area OA2 contact each other, the entire optical area including the first optical area OA1 and the second optical area OA2 can also have various shapes, such as a circle, an ellipse, a quadrangle, a hexagon, an octagon or the like.

Hereinafter, descriptions will be provided based on the first optical area OA1 and the second optical area OA2 having a circular shape. However, one or both of the first optical area OA1 and the second optical area OA2 can have a shape other than a circular shape.

Herein, the display device 100 having the first optical electronic device 11 as a camera located under, or in the lower portion of, the display panel 110 without being exposed to the outside can be referred to as a display (or display device) to which an under-display camera (UDC) technology is applied.

In addition, because the display device 100 does not include a notch or a camera hole for exposing the camera, the display area DA can be increased in size. Also, the size of the bezel area of the display device 100 can be reduced, and the degree of freedom in design can be increased. Although the one or more optical electronic devices 11 and 12 are located to be covered on the back of (under, or in the lower portion of) the display panel 110, that is, hidden and not exposed to the outside, the optical electronic devices 11 and 12 still need to receive or detect light for normally performing predefined functionality.

Further, although the one or more optical electronic devices 11 and 12 are located to be covered on the back of (under, or in the lower portion of) the display panel 110 and located to overlap the display area DA, image display needs to be normally performed in the one or more optical areas OA1 and OA2 overlapping the one or more optical electronic devices 11 and 12 in the display area DA.

Figure 2:
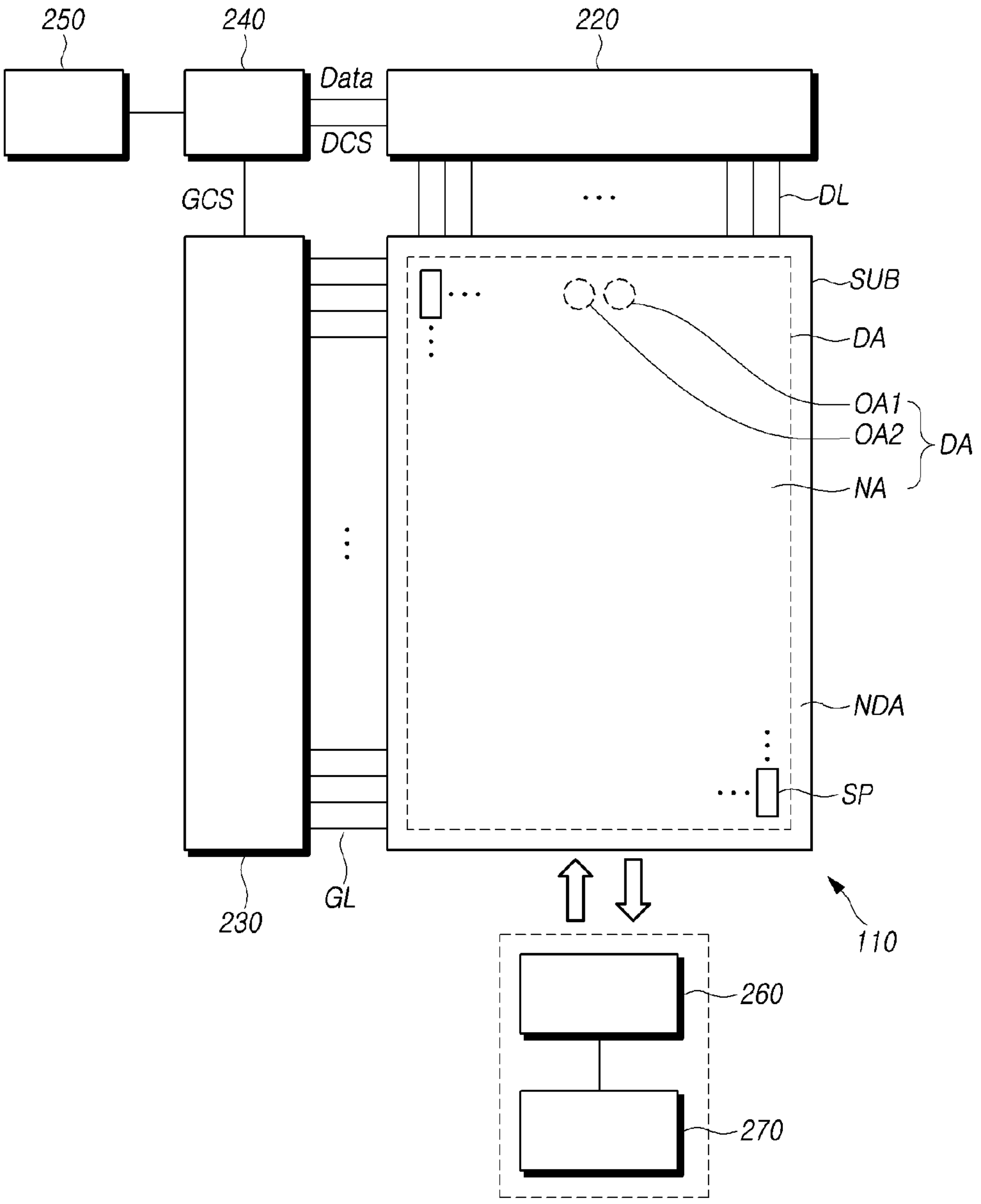
FIG. 2 is a block diagram illustrating the display device according to aspects of the present disclosure.

Next, FIG. 2 is an overview of the display device 100 according to an embodiment of the present disclosure. Referring to FIG. 2, the display device 100 includes the display panel 110 and a display driving circuit as components for displaying an image. The display driving circuit is for driving the display panel 110, and includes a data driving circuit 220, a gate driving circuit 230, a display controller 240, and other components. The display panel 110 includes a display area DA and a non-display area NDA. The non-display area NDA is outside of the display area DA, and can also be referred to as an edge area or a bezel area. All or a portion of the non-display area NDA can be an area visible from the front surface of the display device 100, or an area that is not visible from the front surface of the display device 100 as a corresponding portion is bent.

The display panel 110 includes a plurality of subpixels SP disposed on the substrate SUB and various signal lines to drive the plurality of subpixels SP. In some embodiments, the display device 100 can be a liquid crystal display device, a self-emission display device, etc. When the display device 100 is the self-emission display device, each pixel SP includes a light emitting element.

Further, the display device 100 can also be an organic light emitting display device using an organic light emitting diode (OLED) as a light emitting element. The display device 100 can also be an inorganic light emitting display device using an inorganic material-based light emitting diode. In still another example, the display device 100 can be a quantum dot display device using quantum dots, which are self-emission semiconductor crystals.

In addition, the structure of each pixel SP can vary according to types of the display devices 100. When the display device 100 is a self-emission display device including self-emission subpixels SP, each subpixel SP includes a self-emission light emitting element, one or more transistors, and one or more capacitors. The various types of signal lines arranged in the display device 100 include, for example, a plurality of data lines DL for carrying data signals (which may be referred to as data voltages or image signals), a plurality of gate lines GL for carrying gate signals (which may be referred to as scan signals), and the like.

Further, the data lines DL and the gate lines GL intersect each other with the data lines DL extending in a first direction and the gate lines GL extending in a second direction intersecting the first direction. For example, the first direction can be a column or vertical direction, and the second direction can be a row or horizontal direction. In another example, the first direction can be the row direction, and the second direction can be the column direction.

In addition, the data driving circuit 220 is for driving the data lines DL, and supplies data signals to the data lines DL. Similarly, the gate driving circuit 230 is for driving the gate lines GL, and supplies gate signals to the gate lines GL. Also, the display controller 240 is for controlling the data driving circuit 220 and the gate driving circuit 230, and controls the driving timing for the data lines DL and driving timing for the gate lines GL.

In addition, the display controller 240 supplies a data driving control signal DCS to the data driving circuit 220 to control the data driving circuit 220, and supplies a gate driving control signal GCS to the gate driving circuit 230 to control the gate driving circuit 230. The display controller 240 can also receive input image data from a host system 250 and supply image data Data to the data driving circuit 220 based on the input image data.

Further, the data driving circuit 220 supplies data signals to the data lines DL according to driving timing control of the display controller 240. Also, the data driving circuit 220 can receive the digital image data Data from the display controller 240, convert the received image data Data into analog data signals, and supply the resulting analog data signals to the plurality of data lines DL.

In addition, the gate driving circuit 230 supplies gate signals to the gate lines GL according to a timing control of the display controller 240. Also, the gate driving circuit 230 can receive a first gate voltage corresponding to a turn-on level voltage and a second gate voltage corresponding to a turn-off level voltage along with various gate driving control signals GCS, generate gate signals, and supply the generated gate signals to the gate lines GL. In some embodiments, the data driving circuit 220 can be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 230 can also be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 can be disposed in the non-display area NDA of the display panel 110 in a gate in panel (GIP) type, and the gate driving circuit 230 can be disposed on or over the substrate, or connected to the substrate. That is, for the GIP type, the gate driving circuit 230 can be disposed in the non-display area NDA of the substrate. The gate driving circuit 230 can be connected to the substrate for the chip on glass (COG) type, the chip on film (COF) type, or the like.

In some embodiments, at least one of the data driving circuit 220 and the gate driving circuit 230 can be disposed in the display area DA of the display panel 110. For example, at least one of the data driving circuit 220 and the gate driving circuit 230 can be disposed not to overlap subpixels SP, or disposed to be overlapped with one or more, or all, of the subpixels SP.

In addition, the data driving circuit 220 can also be located on, but not limited to, only one side or portion (e.g., an upper edge or a lower edge) of the display panel 110. In some embodiments, the data driving circuit 220 can be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 can also be located in only one side or portion (e.g., a left edge or a right edge) of the display panel 110. In some embodiments, the gate driving circuit 230 can be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

Further, the display controller 240 may be implemented in a separate component from the data driving circuit 220, or integrated with the data driving circuit 220 and thus implemented in an integrated circuit. In more detail, the display controller 240 is a timing controller used in the display technology or a controller/control device capable of performing other control functions in addition to the function of the typical timing controller. In some embodiments, the display controller 140 can be a controller or a control device different from the timing controller, or a circuitry or a component included in the controller or the control device. The display controller 240 can also be implemented with various circuits or electronic components such as an integrated circuit (IC), a field programmable gate array (FPGA), an application specific integrated circuit (ASIC), a processor, and/or the like.

In addition, the display controller 240 can be mounted on a printed circuit board, a flexible printed circuit, and/or the like and be electrically connected to the data driving circuit 220 and the gate driving circuit 230 through the printed circuit board, flexible printed circuit, and/or the like. The display controller 240 can also transmit signals to, and receive signals from, the data driving circuit 220 via one or more predefined interfaces including, for example, a low voltage differential signaling (LVDS) interface, an embedded clock point-point interface (EPI), a serial peripheral interface (SPI), and the like.

In addition, the display device 100 can include at least one touch sensor, and a touch sensing circuit capable of detecting whether a touch event occurs by a touch object such as a finger, a pen, or the like, or of detecting a corresponding touch position, by sensing the touch sensor to further provide a touch sensing and an image display function. In particular, the touch sensing circuit includes a touch driving circuit 260 capable of generating and providing touch sensing data by driving and sensing the touch sensor, a touch controller 270 capable of detecting the occurrence of a touch event or detecting a touch position using the touch sensing data, and one or more other components. The touch sensor includes a plurality of touch electrodes and include a plurality of touch lines for electrically connecting the plurality of touch electrodes to the touch driving circuit 260.

Further, the touch sensor can be implemented in a touch panel, or in the form of a touch panel, outside of the display panel 110, or be implemented inside of the display panel 110. When the touch sensor is implemented in the touch panel, or in the form of the touch panel, outside of the display panel 110, such a touch sensor is referred to as an add-on type. When the add-on type of touch sensor is disposed, the touch panel and the display panel 110 can be separately manufactured and coupled during an assembly process. The add-on type of touch panel includes a touch panel substrate and a plurality of touch electrodes on the touch panel substrate.

Also, when the touch sensor is implemented inside of the display panel 110, a process of manufacturing the display panel 110 includes disposing the touch sensor over the substrate SUB together with signal lines and electrodes related to driving the display device 100. In addition, the touch driving circuit 260 can supply a touch driving signal to at least one of the plurality of touch electrodes, and sense at least one of the plurality of touch electrodes to generate touch sensing data. The touch sensing circuit can perform touch sensing using a self-capacitance sensing technique or a mutual-capacitance sensing technique. When the touch sensing circuit performs touch sensing in the self-capacitance sensing technique, the touch sensing circuit can perform touch sensing based on a capacitance between each touch electrode and a touch object (e.g., a finger, a pen, and the like).

According to the self-capacitance sensing technique, each of the plurality of touch electrodes can serve as both a driving touch electrode and a sensing touch electrode. Further, the touch driving circuit 260 can drive all, or one or more, of the plurality of touch electrodes and sense all, or one or more, of the plurality of touch electrodes. When the touch sensing circuit performs touch sensing in the mutual-capacitance sensing technique, the touch sensing circuit can perform touch sensing based on capacitance between touch electrodes.

According to the mutual-capacitance sensing technique, the touch electrodes are divided into driving touch electrodes and sensing touch electrodes. Thus, the touch driving circuit 260 can drive the driving touch electrodes and sense the sensing touch electrodes. The touch driving circuit 260 and the touch controller 270 included in the touch sensing circuit can also be implemented in separate devices or in a single device. Further, the touch driving circuit 260 and the data driving circuit 220 can be implemented in separate devices or in a single device. The display device 100 can further include a power supply circuit for supplying various types of power to the display driving circuit and/or the touch sensing circuit.

In addition, the display device 100 can be a mobile terminal such as a smart phone, a tablet, or the like, or a monitor, a television (TV), or the like. Such devices can be of various types, sizes, and shapes. The display device 100 according to embodiments of the present disclosure are not limited thereto, and includes displays of various types, sizes, and shapes for displaying information or images.

As described above, the display area DA of the display panel 110 includes a normal area NA and one or more optical areas OA1 and OA2, for example, as shown in FIGS. 1A-1D. The normal area NA and the one or more optical areas OA1 and OA2 include image display areas. However, the normal area NA does not include a light transmission structure, and the optical areas OA1 and OA2 include the light transmission structure.

As discussed above with respect to the examples of FIGS. 1A-1D, although the display area DA includes the optical areas OA1 and OA2 in addition to the normal area NA, that the following discussion assumes the display area DA includes first and second optical areas OA1 and OA2 and the normal area NA, as in FIGS. 1C and 1D; and the normal area NA includes the normal areas NAs in FIGS. 1A-1D, and the first and second optical areas OA1 and OA2 include the first optical areas OA1*s* in FIGS. 1A-1D and the second optical areas OA2*s* of FIGS. 1C and 1D, respectively, unless explicitly stated otherwise.

Figure 3:
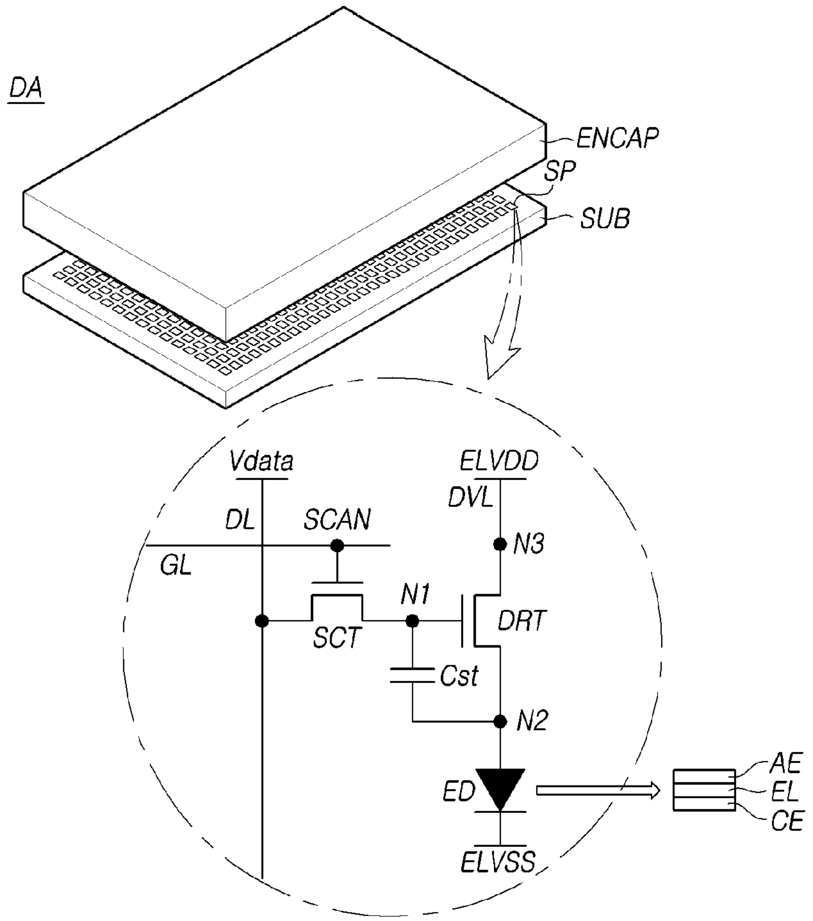
FIG. 3 is an overview of an equivalent circuit of a subpixel in a display panel according to aspects of the present disclosure.

Next, FIG. 3 illustrates an example equivalent circuit of a subpixel SP in the display panel 110 according to an embodiment of the present disclosure. As shown, each subpixel SP disposed in the normal area NA, the first optical area OA1, and the second optical area OA2 included in the display area DA of the display panel 110 includes a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT includes the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 is a gate node, the second node N2 is a source node or a drain node, and the third node N3 is the drain node or the source node.

Also, the light emitting element ED can include an anode electrode AE, an emission layer EL, and a cathode electrode CE. The anode electrode AE is a pixel electrode disposed in each subpixel SP, and is electrically connected to the second node N2 of the driving transistor DRT of each subpixel SP. Further, the cathode electrode CE can be a common electrode commonly disposed in the plurality of subpixels SP, and a base voltage ELVSS such as a low-level voltage may be applied to the cathode electrode CE.

For example, the anode electrode AE can be the pixel electrode, and the cathode electrode CE can be the common electrode. In another example, the anode electrode AE can be the common electrode, and the cathode electrode CE can be the pixel electrode. For convenience of description, the following description assumes the anode electrode AE is the pixel electrode, and the cathode electrode CE is the common electrode unless explicitly stated otherwise.

In addition, the light emitting element ED can be, for example, an organic light emitting diode (OLED), an inorganic light emitting diode, a quantum dot light emitting element, or the like. When an organic light emitting diode is used as the light emitting element ED, the emission layer EL included in the light emitting element ED includes an organic emission layer including an organic material.

Further, the scan transistor SCT can be turned on and off by a scan signal SCAN that is a gate signal applied through a gate line GL, and be electrically connected between the first node N1 of the driving transistor DRT and a data line DL. The storage capacitor Cst can be electrically connected between the first node N1 and the second node N2 of the driving transistor DRT. Also, in FIG. 3, each subpixel SP includes two transistors (2T: DRT and SCT) and one capacitor (1C: Cst) (which may be referred to as a "2T1C structure"), and may further include one or more transistors, or one or more capacitors.

In addition, the storage capacitor Cst, which is disposed between the first node N1 and the second node N2 of the driving transistor DRT, can be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like). Each of the driving transistor DRT and the scan transistor SCT can also be an n-type transistor or a p-type transistor.

Further, each of the driving transistor DRT and the scan transistor SCT can be low-temperature polycrystalline silicon transistors. However, embodiments of the present disclosure are not limited thereto. For example, at least one of the driving transistor DRT and the scan transistor SCT can be an oxide thin film transistor.

In addition, because the circuit elements (e.g., in particular, a light emitting element ED) in each subpixel SP are vulnerable to external moisture or oxygen, an encapsulation layer ENCAP can be disposed in the display panel 110 to prevent the external moisture or oxygen from penetrating into the circuit elements (e.g., in particular, the light emitting element ED). The encapsulation layer ENCAP can also be disposed to cover the light emitting element ED.

Figure 4A:
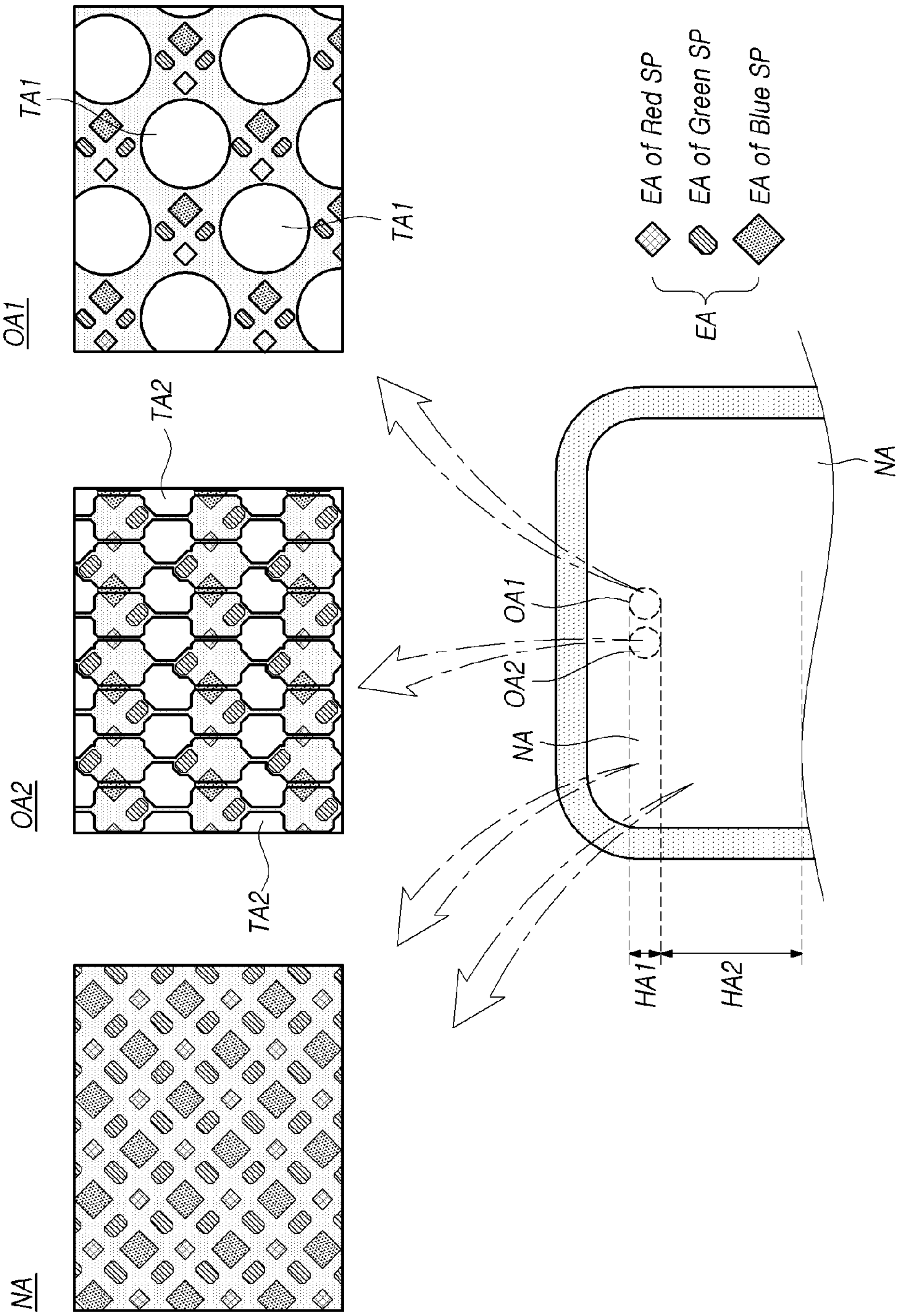
FIG. 4A illustrates example arrangements of subpixels in three areas included in a display area of the display panel according to aspects of the present disclosure.
Figure 4B:
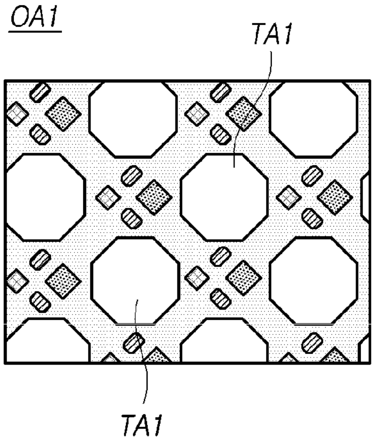
FIG. 4B is an overview illustrating a first optical area of the display panel according to aspects of the present disclosure.

Next, FIG. 4A illustrates example arrangements of subpixels SP in the three areas (NA, OA1, and OA2) included in the display area DA of the display panel 110 according to an embodiment of the present disclosure, and FIG. 4B illustrates another example structure of the first optical area of the display panel 110 according to an embodiment of the present disclosure.

Referring to FIG. 4A, a plurality of subpixels SP are disposed in each of the normal area NA, the first optical area OA1, and the second optical area OA2 included in the display area DA. The subpixels SP may include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 include light emitting areas EA of red subpixels (Red SP), and green subpixels (Green SP), and blue subpixels (Blue SP). Referring to FIG. 4A, the normal area NA includes red, green and light emitting areas EA without a light transmission structure. In contrast, the first and second optical area OA1 and OA2 include both the light emitting areas EA and the light transmission structure.

Accordingly, the first optical area OA1 includes one or more light emitting areas EA and one or more first transmission areas TA1, and the second optical area OA2 includes one or more light emitting areas EA and one or more second transmission areas TA2. Further, the light emitting areas EA and the transmission areas (TA1 and/or TA2) are distinct according to whether the transmission of light is allowed. For example, the light emitting areas EA do not allow light to transmit to the back of the display panel, and the transmission areas (TA1 and/or TA2) allow light to transmit to transmit to the back of the display panel.

The light emitting areas EA and the transmission areas TA1 and/or TA2 can also be distinct according to whether or not a specific metal layer is included. For example, the cathode electrode CE as shown in FIG. 3 can be disposed in the light emitting areas EA, and not disposed in the transmission areas TA1 and/or TA2. In some embodiments, a light shield layer can be disposed in the light emitting areas EA, and not be disposed in the transmission areas TA1 and/or TA2.

Because the first and second optical areas OA1 and OA2 respectively include the first and second transmission areas TA1 and TA2, first and second optical areas OA1 and OA2 are areas through which light can transmit. In addition, a transmittance (i.e., a degree of transmission) of the first optical area OA1 and a transmittance of the second optical area OA2 can be substantially equal. For example, the first and second transmission areas TA1 and TA2 can have substantially the same shape or size. In another example, even when the first and second transmission areas TA1 and TA2 have different shapes or sizes, a ratio of the first transmission area TA1 to the first optical area OA1 and a ratio of the second transmission area TA2 to the second optical area OA2 can be substantially equal. In one example, each of the first transmission areas TA1*s* has the same shape and size, and each of the second transmission areas TA2*s* has the same shape and size.

In another embodiment, a transmittance of the first and second optical areas OA1 and OA2 can be different from each other. For example, the first and second transmission area TA1 TA2 can have different shapes or sizes. In another example, even when the first and second transmission areas TA1 TA2 have substantially the same shape or size, a ratio of the first transmission area TA1 to the first optical area OA1 and a ratio of the second transmission area TA2 to the second optical area OA2 can be different from each other.

For example, when the first optical electronic device 11 is a camera and the second optical electronic device 12 is a sensor for detecting images, the camera 11 can be configured to receive a greater amount of light than the sensor 12 using the first and second transmission areas for example. That is, the transmittance of the first optical area OA1 can be greater than the transmittance of the second optical area OA2.

In more detail, in one example, the first transmission area TA1 can be configured to have a size greater than the second transmission area TA2. In another example as described above, even when the first and second transmission areas TA1 and TA2 have substantially the same size, a ratio of the first transmission area TA1 to the first optical area OA1 can be greater than a ratio of the second transmission area TA2 to the second optical area OA2.

As shown in FIG. 4A, the first transmission area TA1 has a circular shape in a cross-sectional view, but is not limited thereto. For example, as shown in FIG. 4B, the first transmission area TA1 has have an octagonal shape. The first transmission area TA1 can also have an elliptical or polygonal shape.

Thus, the transmittance of the first transmission area TA1 and an area or size of the light emitting area of the first optical area OA1 can be adjusted, by changing a shape of the first transmission area TA1. For convenience, the following description describes the transmittance of the first optical area OA1 is greater than the transmittance of the second optical area OA2.

Further, the transmission areas TA1 and/or TA2 as shown in FIG. 4A can be referred to as transparent areas, and the term transmittance can be referred to as transparency. Further, the following description assumes the first and second optical areas OA1 and OA2 are located in an upper edge of the display area DA, and are disposed to be horizontally adjacent to each other in a direction in which the upper edge extends, as shown in FIG. 4A.

Referring to FIG. 4A, a horizontal display area including the first and second optical areas OA1 and OA2 is referred to as a first horizontal display area HAL and another horizontal display area not including the first and second optical areas OA1 and OA2 is referred to as a second horizontal display area HA2. Also, the first horizontal display area HA1 includes a portion of the normal area NA, the first optical area OA1, and the second optical area OA2, and the second horizontal display area HA2 includes only the normal area NA.

Figure 5A:
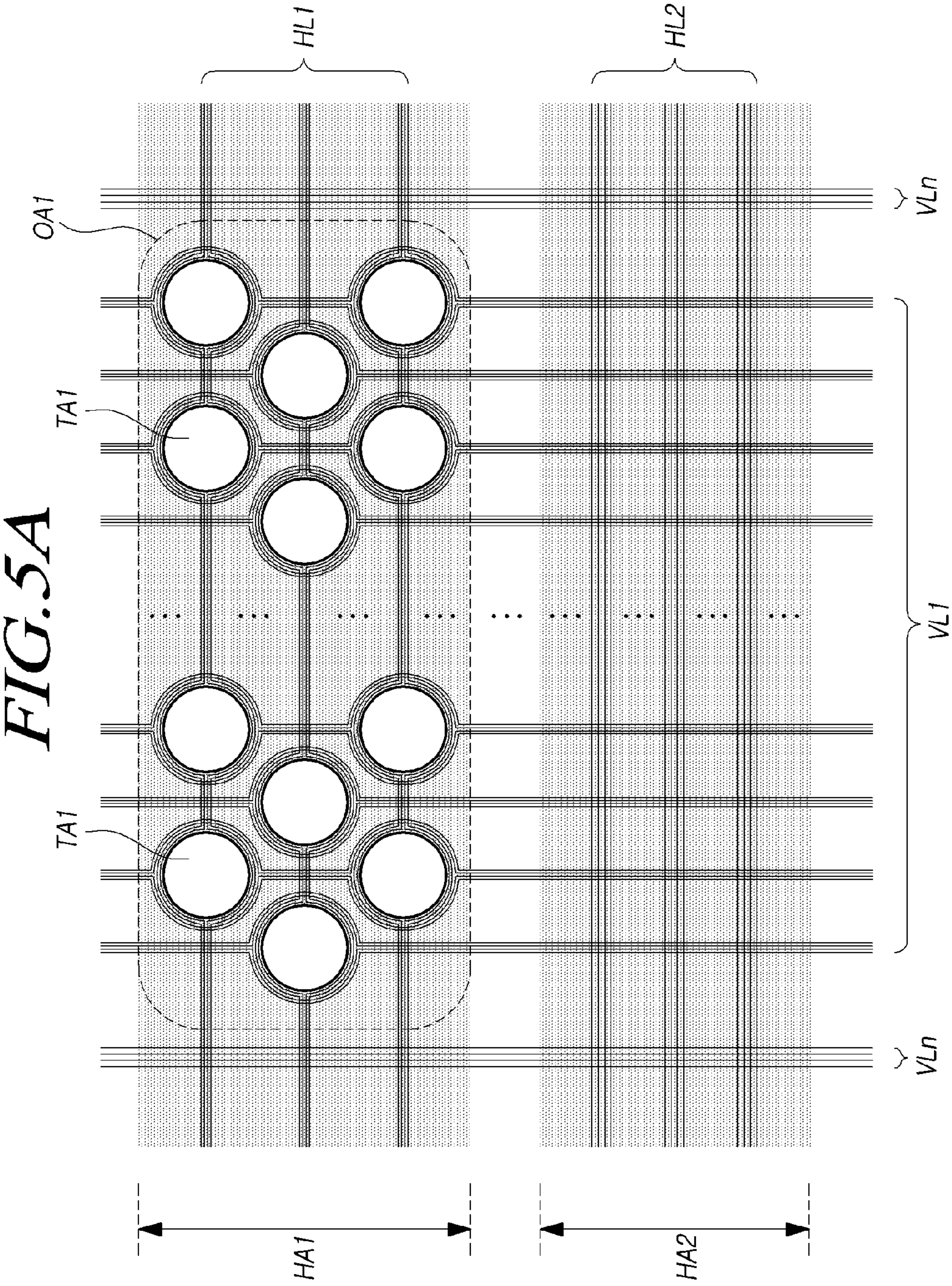
FIG. 5A is an overview illustrating signal lines in each of the first optical area and a normal area in the display panel according to aspects of the present disclosure.
Figure 5B:
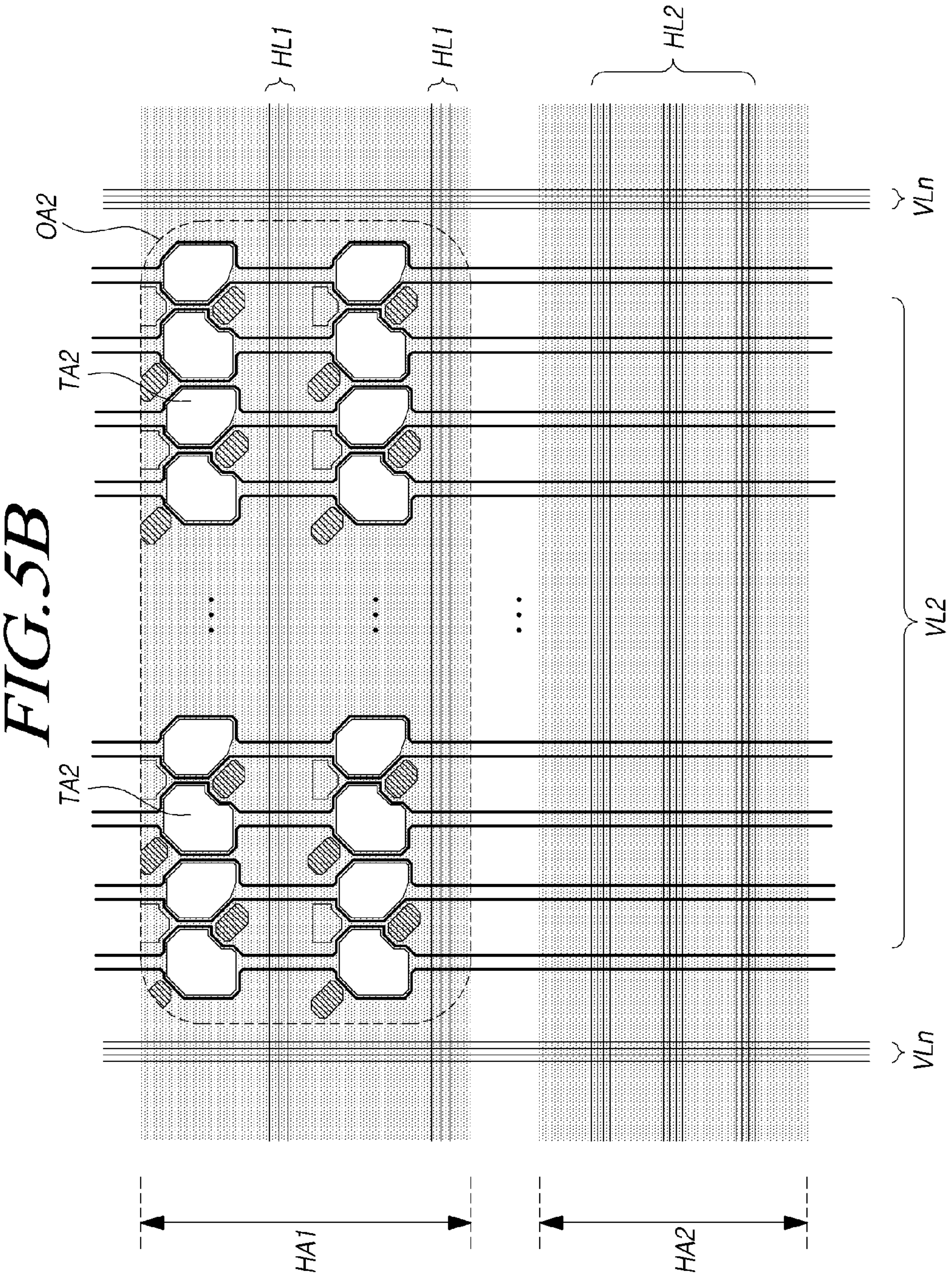
FIG. 5B is an overview illustrating signal lines in each of a second optical area and the normal area in the display panel according to aspects of the present disclosure.

Next, FIG. 5A illustrates arrangements of signal lines in each of the first optical area OA1 and the normal area NA according to an embodiment of the present disclosure, and FIG. 5B illustrates arrangements of signal lines in each of the second optical area OA2 and the normal area NA according to an embodiment of the present disclosure. In additions, FIGS. 5A and 5B illustrate first horizontal display areas HA1 are portions of the first horizontal display area HA1 and second horizontal display area HA2 are portions of the second horizontal display area HA2.

Further, the first optical area OA1 shown in FIG. 5A is only a portion of the first optical area OA1, and the second optical area OA2 shown in FIG. 5B is only a portion of the second optical area OA2. Referring to FIGS. 5A and 5B, the first horizontal display area HA1 includes a portion of the normal area NA, the first optical area OA1, and the second optical area OA2. In addition, the second horizontal display area HA2 includes another portion of the normal area NA.

As shown, various types of horizontal lines HL1 and HL2 and vertical lines VLn, VL1, and VL2 are disposed in the display panel 110. In some embodiments, the term "horizontal" and the term "vertical" are used to refer to two directions intersecting the display panel; however, the horizontal direction and the vertical direction can be changed depending on a viewing direction. The horizontal direction refers to, for example, a direction in which one gate line GL extends and, and the vertical direction refers to, for example, a direction in which one data line DL extends. As such, the terms horizontal and vertical are used to represent two directions.

Referring to FIGS. 5A and 5B, the horizontal lines disposed in the display panel 110 includes first horizontal lines HL1 disposed in the first horizontal display area HA1 and second horizontal lines HL2 disposed on the second horizontal display area HA2. Also, the horizontal lines disposed in the display panel 110 can be gate lines GL. That is, the first and second horizontal lines HL1 and HL2 can be the gate lines GL. In addition, the gate lines GL includes various types of gate lines according to structures of one or more subpixels SP.

Referring to FIGS. 5A and 5B, the vertical lines disposed in the display panel 110 includes vertical lines VLn disposed only in the normal area NA, first vertical lines VL1 running through both of the first optical area OA1 and the normal area NA, and second vertical lines VL2 running through both of the second optical area OA2 and the normal area NA. The vertical lines disposed in the display panel 110 include data lines DL, driving voltage lines DVL, reference voltage lines, initialization voltage lines, etc. That is, the vertical lines VLn, the first vertical lines VL1 and the second vertical lines VL2 include the data lines DL, the driving voltage lines DVL, the reference voltage lines, the initialization voltage lines, etc.

In addition, the term "horizontal" in the second horizontal line HL2 can mean only that a signal is carried from a left side to a right side of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 can include bent or folded portions that are different from the configurations shown in FIGS. 5A and 5B. Likewise, one or more of the first horizontal lines HL1 can also include bent or folded portions.

Also, the term "vertical" in the vertical line VLn can mean only that a signal is carried from an upper portion, to a lower portion of the display panel (or from the lower portion to the upper portion), and may not mean that the vertical line VLn runs in a straight line only in the direct vertical direction. For example, in FIGS. 5A and 5B, although the typical vertical lines VLn are illustrated in a straight line, the vertical lines VLn can include bent or folded portions that are different from the configurations shown in FIGS. 5A and 5B. Likewise, one or more of the first and second vertical lines VL1 and VL2 can also include bent or folded portions.

Referring to FIG. 5A, the first optical area OA1 included in the first horizontal display area HA1 includes light emitting areas EA (see FIG. 4A), and first transmission areas TA1. As shown inn FIG. 5A, in the first optical area OA1, respective outer areas of the first transmission areas TA1 include corresponding light emitting areas EA.

Also, to improve the transmittance of the first optical area OA1, the first horizontal lines HL1 run through the first optical area OA1 while avoiding the first transmission areas TA1 in the first optical area OA1. Accordingly, each of the first horizontal lines HL1 running through the first optical area OA1 includes curved or bent portions running around respective outer edges of the first transmission areas TA1. Accordingly, the first horizontal lines HL1 disposed in the first horizontal display area HA1 and the second horizontal lines HL2 disposed in the second horizontal display area HA2 may have different shapes or lengths. For example, the first horizontal lines HL1 running through the first optical area OA1 and the second horizontal lines HL2 not running through the first optical area OA1 have different shapes or lengths.

Further, to improve the transmittance of the first optical area OA1, the first vertical lines VL1 run through the first optical area OA1 while avoiding the first transmission areas TA1 in the first optical area OA1. Accordingly, each of the first vertical lines VL1 running through the first optical area OA1 includes curved or bent portions running around respective outer edges of the first transmission areas TA1. Thus, the first vertical lines VL1 running through the first optical area OA1 and the typical vertical lines VLn disposed in the normal area NA without running through the first optical area OA1 have different shapes or lengths.

Referring to FIG. 5A, the first transmission areas TA1 included in the first optical area OA1 in the first horizontal display area HA1 are arranged in a diagonal direction. As shown, in the first optical area OA1, one or more light emitting areas EA can be disposed between two horizontally adjacent first transmission areas TA1. For example, in the first optical area OA1, one or more light emitting areas EA can be disposed between two vertically adjacent first transmission areas TA1.

In addition, each first horizontal lines HL1 disposed in the first horizontal display area HA1 (e.g., each of the first horizontal lines HL1 running through the first optical area OA1) includes curved or bent portions running around respective outer edges of the first transmission areas TA1.

Referring to FIG. 5B, the second optical area OA2 included in the first horizontal display area HA1 includes light emitting areas EA and second transmission areas TA2. In the second optical area OA2, respective outer areas of the second transmission areas TA2 include corresponding light emitting areas EA. In one embodiment, the light emitting areas EA and the second transmission areas TA2 in the second optical area OA2 can have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 can have locations and arrangements different from the light emitting areas EA and the first transmission areas TA1 in the first optical area OA1 of FIG. 5A. For example, referring to FIG. 5B, the second transmission areas TA2 in the second optical area OA2 are arranged in the horizontal direction (the left to right or right to left direction). In this example, a light emitting area EA is not disposed between two second transmission areas TA2 adjacent to each other in the horizontal direction. Further, one or more of the light emitting areas EA in the second optical area OA2 are disposed between second transmission areas TA2 adjacent to each other in the vertical direction (the top to bottom or bottom to top direction). For example, one or more light emitting areas EA can be disposed between two rows of second transmission areas.

When in the first horizontal display area HAL running through the second optical area OA2 and the normal area NA adjacent to the second optical area OA2, the first horizontal lines HL1 can have substantially the same arrangement as the first horizontal lines HL1 of FIG. 5A. In another embodiment, as shown in FIG. 5B, when in the first horizontal display area HAL running through the second optical area OA2 and the normal area NA adjacent to the second optical area OA2, the first horizontal lines HL1 can have an arrangement different from the first horizontal lines HL1 of FIG. 5A. This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal display area HAL the first horizontal lines HL1 run through the second optical area OA2 and the normal area NA adjacent to the second optical area OA2, and the first horizontal lines HL1 can run between vertically adjacent second transmission areas TA2 in a straight line without having a curved or bent portion. For example, one first horizontal line HL1 can have curved or bent portions in the first optical area OA1, but not have a curved or bent portion in the second optical area OA2.

To improve the transmittance of the second optical area OA2, the second vertical lines VL2 can run through the second optical area OA2 while avoiding the second transmission areas TA2 in the second optical area OA2. Accordingly, each of the second vertical lines VL2 running through the second optical area OA2 includes curved or bent portions running around respective outer edges of the second transmission areas TA2.

Thus, the second vertical lines VL2 running through the second optical area OA2 and the typical vertical lines VLn disposed in the normal area NA without running through the second optical area OA2 can have different shapes or lengths. As shown in FIG. 5A, each, or one or more, of the first horizontal lines HL1 running through the first optical area OA1 can have one or more curved or bent portions running around one or more respective outer edges of one or more of the first transmission areas TA1.

Accordingly, a length of the first horizontal line HL1 running through the first optical area OA1 and the second optical area OA2 can be slightly longer than a length of the second horizontal line HL2 disposed only in the normal area NA without running through the first optical area OA1 and the second optical area OA2. Therefore, a resistance of the first horizontal line HL1 running through the first optical area OA1 and the second optical area OA2, which is referred to as a first resistance, can be slightly greater than a resistance of the second horizontal line HL2 disposed only in the normal area NA without running through the first optical area OA1 and the second optical area OA2, which is referred to as a second resistance.

Referring to FIGS. 5A and 5B, according to a light transmitting structure, because the first optical area OA1 that at least partially overlaps the first optical electronic device 11 includes the first transmitting areas TA1, and the second optical area OA2 that at least partially overlaps with the second optical electronic device 12 includes the second transmission areas TA2, the first and second optical areas OA1 and OA2 can have a smaller number of subpixels per unit area than the normal area NA.

Accordingly, the number of subpixels connected to each, or one or more, of the first horizontal lines HL1 running through the first and second optical areas OA1 and OA2 can be different from the number of subpixels connected to each, or one or more, of the second horizontal lines HL2 disposed only in the normal area NA without running through the first optical area OA1 and the second optical area OA2.

Further, the number of subpixels connected to each, or one or more, of the first horizontal lines HL1 running through the first optical area OA1 and the second optical area OA2, which is referred to as a first number, can be less than the number of subpixels connected to each, or one or more, of the second horizontal lines HL2 disposed only in the normal area NA without running through the first optical area OA1 and the second optical area OA2, which is referred to as a second number.

A difference between the first and second numbers can vary according to a difference between a resolution of each of the first and second optical areas OA1 and OA2 and a resolution of the normal area NA. For example, as a difference between a resolution of each of the first and second optical areas OA1 and OA2 and a resolution of the normal area NA increases, a difference between the first and second numbers increases.

As described above, because the number (the first number) of subpixels connected to each, or one or more, of the first horizontal lines HL1 running through the first optical area OA1 and the second optical area OA2 is less than the number of subpixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 can be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, can be much smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, can be much less than an RC value of the second horizontal lines HL2 disposed only in the normal area NA without running through the first optical area OA1 and the second optical area OA2, which is referred to as a second RC value. Thus, in this example, the first RC value is much smaller than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 can be different from a signal transmission characteristic through the second horizontal line HL2.

Figure 6A:
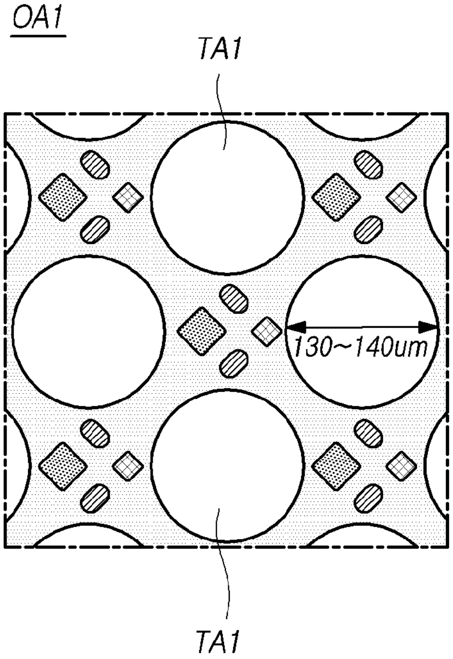
FIGS. 6A and 6B are overviews illustrating a first optical area and a second optical area included in a display area of the display panel according to aspects of the present disclosure.
Figure 6B:
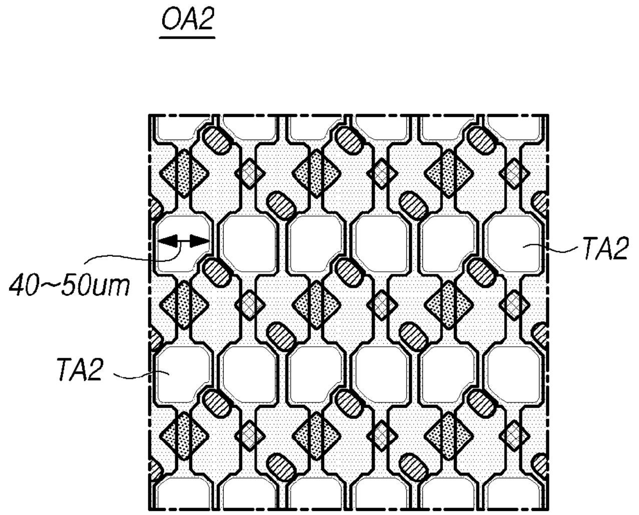

Next, FIGS. 6A and 6B illustrate a first optical area OA1 and a second optical area OA2 included in a display area DA of the display panel 110 according to an embodiment of the present disclosure. Referring to FIGS. 6A and 6B, respective luminance of the normal area NA, the first optical area OA1, and the second optical area OA2 can be configured to be different from one another. In general, the higher the resolution is, the greater the corresponding image quality is. Therefore, while the normal area NA is designed to have a high pixels per inch (PPI), the first optical area OA1 where the camera is disposed or the second optical area OA2 where the sensor is disposed can be designed to have a lower resolution to increase transmittance compared to the normal area NA.

When a first transmission area TA1 with a larger size or area is formed in the first optical area OA1 for implementing the under-display camera (UDC) technology, a distance between pixels emitting light increases, and thereby, corresponding image quality is deteriorated. In contrast, when a first transmission area TA1 with a smaller size or area is formed in the first optical area OA1, a haze phenomenon or a ghost phenomenon may occur, and thereby, characteristics of the camera can be deteriorated.

Accordingly, one or more first transmission areas TA1 can be formed to have an area similar to that of a unit pixel area in the first optical area OA1. However, embodiments of the present disclosure are not limited thereto. For example, one or more first transmission areas TA1 can be formed to have a larger or smaller area than the unit pixel area.

In addition, as a level of flare among characteristics of a camera disposed in the first optical area OA1 can vary depending on a shape of the first transmission area TA1, it is preferable the first transmission area TA1 is configured to have a shape similar to a circular shape. Also, as shown in FIG. 6A, a width of the first transmission area TA1 can be 130 to 140 μm.

Further, unlike the first optical area OA1 in which characteristics of the camera act as important factors, the second optical area OA2 includes a detecting sensor. In addition, the transmittance is an important factor for accurate sensing. When the sensor is an infrared sensor, the second transmission area TA2 can be formed so a transmittance with a certain level in an infrared wavelength band can be achieved while considering image quality.

Accordingly, one or more second transmission areas TA2 can be formed to have an area of a unit subpixel. However, embodiments of the present disclosure are not limited thereto. For example, one or more second transmission areas TA2 can be formed to have a larger or smaller area than the unit subpixel area in the second optical area OA2.

In addition, because the second optical area OA2 covers the detecting sensor and is independent of the characteristics of the camera, one or more second transmission areas TA2 can be formed in various shapes such as a circle, an ellipse, a polygon, and the like, which provides an improved transmittance compared to a circle.

Because the transmittance of the infrared detection sensor is not affected by the substrate SUB formed of a polyimide material, it may not be needed to remove, or reduce a thickness of the substrate SUB. In addition, the sensor includes one or more of various sensors other than the infrared sensor, and a material of the substrate SUB can also be changed according to a desired design.

Figure 7A:
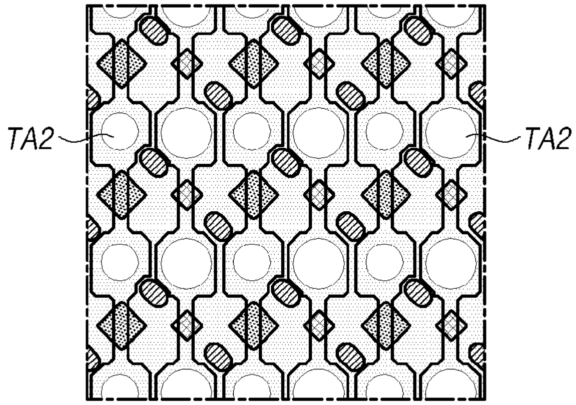
FIGS. 7A, 7B and 7C are overviews illustrating second optical areas included in the display area of the display panel according to aspects of the present disclosure.
Figure 7B:
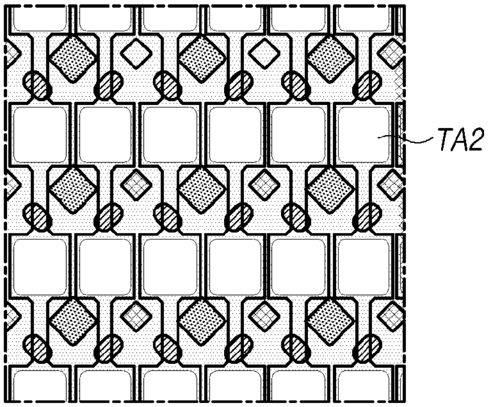
Figure 7C:
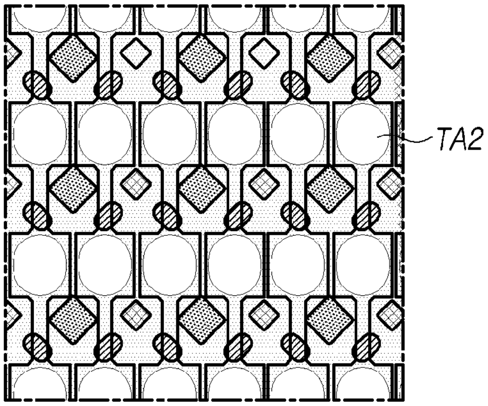

Next, FIGS. 7A-7C illustrate second optical areas OA2 included in the display area DA of the display panel 110 according to an embodiment of the present disclosure. Referring to FIGS. 7A-7C, one or more second transmission areas TA2 can be formed in various shapes. Further as shown in FIG. 7A, a width of the at least one of the one or more second transmission area can be 40 to 50 μm.

Also, second transmission areas TA2 having different areas can be alternately formed between adjacent subpixels. For example, the second transmission areas TA2 having different areas can be formed between adjacent subpixels according to shapes of light emitting areas EA of the subpixels. Referring to FIGS. 7B and 7C, the second transmission areas TA2 are formed not to overlap areas in which light emitting areas EA of the subpixels are located. As the second optical area OA2 in the example of FIG. 7A can include a larger number of light emitting areas EA of subpixels than the second optical area OA2 in the example of FIG. 7B or 7C, the second optical area OA2 in the example of FIG. 7A can have a relatively higher resolution than the second optical area OA2 in the example of FIG. 7B or 7C. In contrast, as each second transmission area TA2 in the embodiment of FIG. 7B or 7C can have a larger size or area than each second transmission area TA2 in the example of FIG. 7A, a sensor employed in the embodiment of FIG. 7B or 7C can have more excellent transmittance performance than a sensor employed in the example of FIG. 7A.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The above description and the accompanying drawings provide an example of the technical idea of the present invention for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

What is claimed is:

1. A display device comprising:

a display panel including a plurality of light emitting areas;

a first optical electronic device located under the display panel;

a second optical electronic device located under the display panel, wherein a first optical area of the display panel overlapping the first optical electronic device comprises a plurality of first light transmission areas in addition to the plurality of light emitting areas, wherein a second optical area of the display panel overlapping the second optical electronic device comprises a plurality of second light transmission areas in addition to the plurality of light emitting areas, wherein a third optical area of the display panel not overlapping the first and second optical electronic devices includes the plurality of light emitting areas without including the first and second light transmission areas, wherein the first light transmission areas have a different shape or size than the second light transmission areas so a light transmittance of incident light through the first light transmission areas is different than a light transmittance of incident light through the second light transmission areas, wherein the second light transmission areas have the same shape but different sizes and are alternately arranged along a same row line, in the second optical area, and wherein no light emitting area is disposed between any adjacent second transmission areas having different sizes along the same row line.

2. The display device according to claim 1, wherein an area or a size of each of the first light transmission areas is greater than an area or a size of each of the second light transmission areas.

3. The display device according to claim 1, wherein at least one of the first light transmission areas has an area or a size of a unit pixel.

4. The display device according to claim 3, wherein a width of the at least one of the first light transmission areas is 130 to 140 μm.

5. The display device according to claim 3, wherein the at least one of the first light transmission areas has a circular, elliptical, or polygonal shape.

6. The display device according to claim 1, wherein at least one of the second light transmission areas has an area or a size of a unit subpixel.

7. The display device according to claim 6, wherein a width of the at least one of the second light transmission areas is 40 to 50 μm.

8. The display device according to claim 6, wherein the at least one of the second light transmission areas has a circular, elliptical, or polygonal shape.

9. The display device according to claim 1, wherein the second light transmission areas are disposed between the light emitting areas without overlapping the light emitting areas in the second optical area.

10. The display device according to claim 1, wherein the third optical area is additionally disposed between the first optical area and the second optical area.

11. The display device according to claim 1, wherein the first and second light transmission areas are disposed in an upper portion of the display panel and contact each other.

12. The display device according to claim 1, wherein the first optical electronic device is a camera, and the second optical electronic device is a sensor.

13. The display device according to claim 1, wherein a number of subpixels per unit area in the first optical area is less than a number of subpixels per unit area in the third optical area, and a number of subpixels per unit area in the second optical area is greater than or equal to the number of subpixels per unit area in the first optical area.

14. The display device according to claim 1, wherein the display panel further comprises a cathode electrode disposed in respective light emitting areas included in the third optical area and the first optical area, and not disposed in the first light transmission areas.

15. The display device according to claim 1, wherein the first light transmission areas included in the first optical area are arranged in a diagonal direction.

16. The display device according to claim 1, wherein the second light transmission areas included in the second optical area are arranged in a horizontal direction.

17. The display device according to claim 1, wherein the third optical area includes more light emitting areas per square inch than light emitting areas included in the first or second optical areas.

18. The display device according to claim 1, wherein the light transmittance of incident light through the first light transmission areas is greater than the light transmittance of incident light through the second light transmission areas.

* * * * *